United States Patent
Singh et al.

(10) Patent No.: US 12,276,992 B2
(45) Date of Patent: Apr. 15, 2025

(54) AUXILIARY SUPPLY CIRCUIT

(71) Applicant: TEXAS INSTRUMENTS INCORPORATED, Dallas, TX (US)

(72) Inventors: Tarunvir Singh, Bengaluru (IN); Shubham Panjrath, Bengaluru (IN); Anant Kamath, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 18/309,613

(22) Filed: Apr. 28, 2023

(65) Prior Publication Data

US 2024/0361789 A1 Oct. 31, 2024

(51) Int. Cl.
*G05F 1/56* (2006.01)
*H03K 17/687* (2006.01)

(52) U.S. Cl.
CPC ........... *G05F 1/56* (2013.01); *H03K 17/6871* (2013.01)

(58) Field of Classification Search
CPC .................................................... H03K 17/063
See application file for complete search history.

(56) References Cited

U.S. PATENT DOCUMENTS

| | | | |
|---|---|---|---|
| 6,310,565 B1* | 10/2001 | Ong | G11C 27/024 341/122 |
| 8,143,923 B2* | 3/2012 | Ball | H02M 3/1588 363/73 |
| 2008/0192396 A1* | 8/2008 | Zhou | H02H 3/207 361/86 |
| 2015/0102856 A1* | 4/2015 | Barrett, Jr. | G05F 3/30 327/539 |

* cited by examiner

*Primary Examiner* — Metasebia T Retebo
(74) *Attorney, Agent, or Firm* — Mandy Barsilai Fernandez; Frank D. Cimino

(57) ABSTRACT

A circuit includes a supply circuit having an input and an output. The supply circuit includes: a capacitor having a first terminal and a second terminal, the first terminal of the capacitor coupled to the output of the supply circuit; a switch having a first terminal, a second terminal, and a control terminal, the first terminal of the switch coupled to the input of the supply circuit, the second terminal of the switch coupled to the output of the supply circuit; and a controller coupled to the control terminal of the switch. The controller is configured to: turn on the switch responsive to a first supply voltage level at the input of the supply circuit; and turn off the switch responsive to a second supply voltage level at the input of the supply circuit.

17 Claims, 6 Drawing Sheets

AUXILIARY SUPPLY CIRCUIT

BACKGROUND

Communication systems are sometimes affected by power loss issues, resulting in loss of data or a recovery interval. As communication speeds increase, even a temporary power loss can result in undesirable loss of data and delays. In a communication system integrated circuit (IC), some circuits are slower to recover than others when power is restored. Efforts to reduce recovery time of IC circuits may include use of higher currents or accepting a lower accuracy. In some scenarios, higher currents and/or lower accuracy is unacceptable.

SUMMARY

In an example, a circuit includes: a reference circuit having an input; and a supply circuit having an input and an output. The output of the supply circuit is coupled to the input of the reference circuit. The supply circuit includes: a capacitor having a first terminal and a second terminal, the first terminal of the capacitor coupled to the output of the supply circuit; a switch having a first terminal, a second terminal, and a control terminal, the first terminal of the switch coupled to the input of the supply circuit, the second terminal of the switch coupled to the output of the supply circuit; and a controller coupled to the control terminal of the switch. The controller is configured to: turn on the switch responsive to a first supply voltage level at the input of the supply circuit; and turn off the switch responsive to a second supply voltage level at the input of the supply circuit.

In another example, a circuit includes a supply circuit having an input and an output. The supply circuit includes: a first resistor having a first terminal and a second terminal, the second terminal of the first resistor coupled to the output; a capacitor having a first terminal and a second terminal, the first terminal of the capacitor coupled to the output; a first switch having a first terminal, a second terminal, and a control terminal, the first terminal of the first switch coupled to the input, and the second terminal of the first switch coupled to the first terminal of the first resistor; a second resistor having a first terminal and a second terminal; and a second switch having a first terminal, a second terminal, and a control terminal, the first terminal of the second switch coupled to the control terminal of the first switch, and the second terminal of the second switch coupled to the first terminal of the second resistor.

In another example, a circuit includes a supply circuit having an input and an output. The supply circuit includes: first resistor having a first terminal and a second terminal, the second terminal of the first resistor coupled to the output; a capacitor having a first terminal and a second terminal, the first terminal of the capacitor coupled to the output; a first transistor having a first terminal, a second terminal, and a control terminal, the first terminal of the first transistor coupled to the input, and the second terminal of the first transistor coupled to the first terminal of the first resistor; and a second transistor having a first terminal, a second terminal, and a control terminal, the first terminal of the second transistor coupled to the first terminal of the first resistor, and the second terminal of the second transistor coupled to the control terminal of the first transistor.

DETAILED DESCRIPTION

Figure 1:
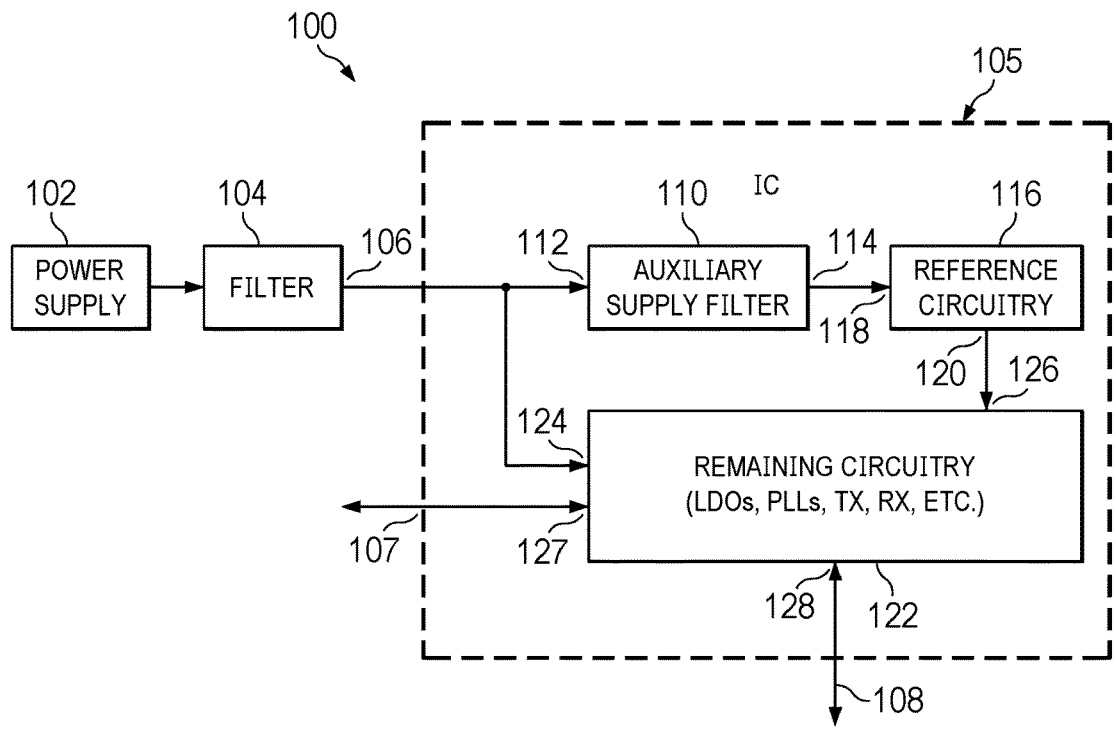
FIG. 1 is a diagram showing an example integrated circuit (IC) including an auxiliary supply filter circuit.

The same reference numbers or other reference designators are used in the drawings to designate the same or similar features. Such features may be the same or similar either by function and/or structure.

Figure 3:
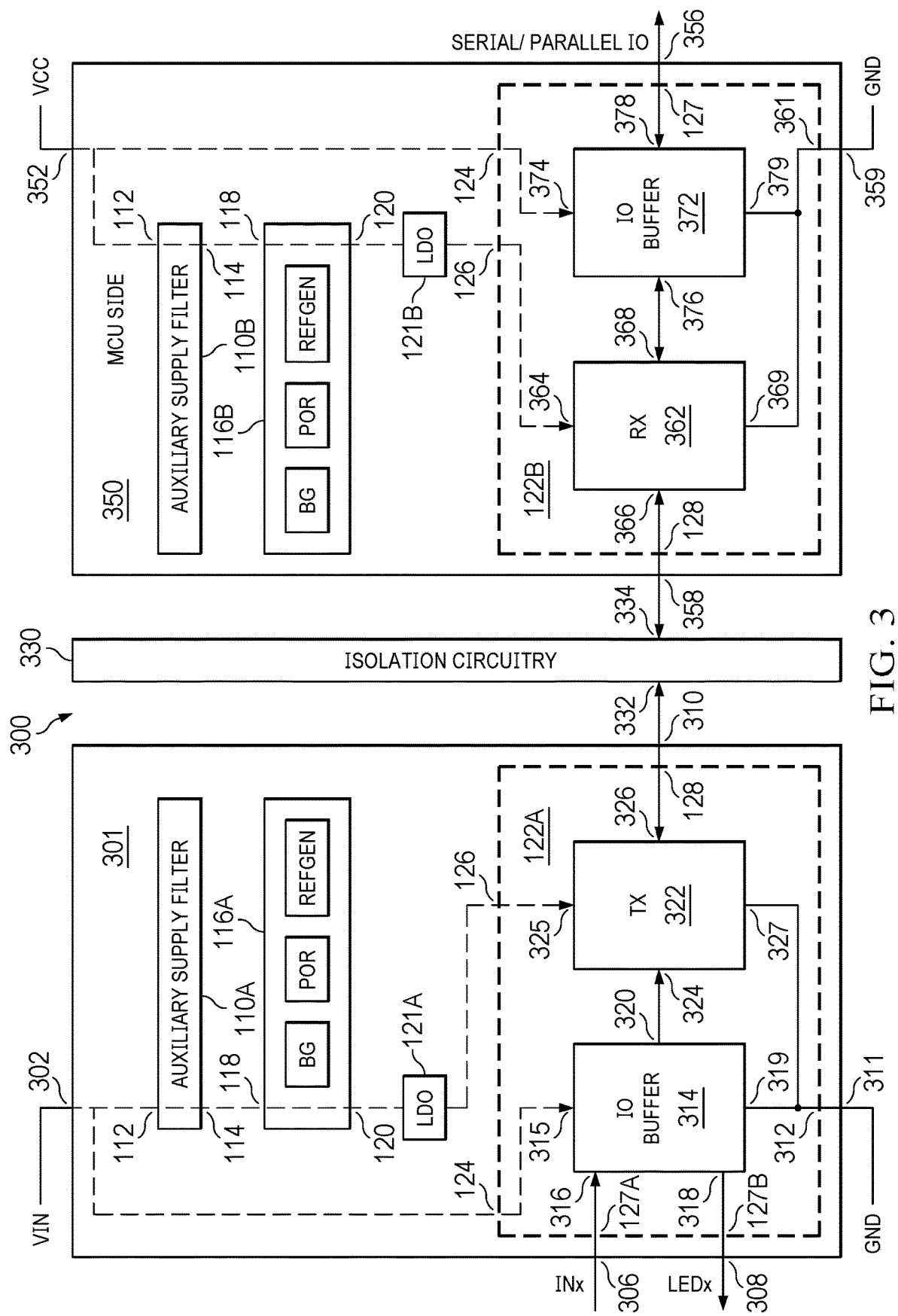
FIG. 3 is a diagram showing an example circuit including an auxiliary supply filter circuit.

FIG. 1 is a diagram 100 showing an example integrated circuit (IC) 105 including an auxiliary supply filter circuit 110. As used herein, an "auxiliary supply filter circuit" or a "supply filter circuit" or a "supply circuit" may interchangeably refer to an internal IC circuit that receives an input power supply signal (e.g., external from the IC) and responsively provides a power supply signal, including in the event the input power supply signal is disrupted. For example, a signal is disrupted when the input signal ceases to be provided or the input signal is reduced such that at least some circuitry relying on the input signal cannot properly operate. The auxiliary supply filter circuit or the supply filter circuit or the supply circuit may also filter the received power supply signal. Without limitation, an auxiliary supply filter circuit or a supply filter circuit or a supply circuit may supplement another filter external to the IC as shown in FIG. 3.

In the example of FIG. 1, the IC 105 has a first terminal 106, a second terminal 107, and a third terminal 108. The IC 105 includes the auxiliary supply filter circuit 110, reference circuitry 116, and remaining circuitry 122. The reference circuitry 116 may include, for example, a voltage reference circuit and/or a current reference circuit, such as a high precision voltage reference that can be used to create a 0.1% (or less) total error voltage reference. The remaining circuitry 122 may include power regulator circuits and/or clock regulator circuits. Example circuits of the remaining circuitry 122 may include low dropout regulators (LDOs), phase-locked loops (PLLs), a transmitter (TX), a receiver (RX), and/or other circuits. In some examples, the IC 105 includes or is part of a communication interface to enable communications between two end-points. Without limitation, the end-points may be processors, sensors, or other components.

As shown, the auxiliary supply filter circuit 110 has an input 112 and an output 114. The reference circuitry 116 has an input 118 and an output 120. The remaining circuitry 122 has a first input 124, a second input 126, a first terminal 127, and a second terminal 128. FIG. 1 also includes a power supply 102 having an output and a filter 104 having an input and an output. The power supply 102 and the filter 104 are external to the IC 105.

In the example of FIG. 1, the output of the power supply 102 is coupled to the input of the filter 104. The output of the filter 104 is coupled to the first terminal 106 of the IC 105. The input 112 of the auxiliary supply filter circuit 110 is coupled to the first terminal 106 of the IC 105. The output 114 of the auxiliary supply filter circuit 110 is coupled to the input 118 of the reference circuitry 116. The output 120 of the reference circuitry 116 is coupled to the second input 126 of the remaining circuitry 122. The first input 124 of the remaining circuitry is coupled to the first terminal 106 of the IC 105. The first terminal 127 of the remaining circuitry 122 is coupled to the second terminal 107 of the IC 105. The second terminal 128 of the remaining circuitry 122 is coupled to the third terminal 108 of the IC 105.

In some examples, the IC 105 operates to: receive filtered power at the first terminal 106; and convey communications between the second terminal 107 and the third terminal 108 responsive to the filtered power, the operations of the auxiliary supply filter circuit 110, the operations of the reference circuitry 116, and the operations of the remaining circuitry 122. If there is a disruption to the power supply 102, the auxiliary supply filter circuit 110 operates to temporarily provide power to the reference circuitry 116. The remaining circuitry 122 is powered off during a disruption to the power supply 102. Once power from the power supply 102 is restored, normal operations of the IC 105 continue. In this example, the reference circuitry 116 has a longer recovery time compared to the remaining circuitry 122. Thus, with the auxiliary supply filter circuit 110, the reference circuitry 116 stays on in the event of a temporary power disruption. By using the auxiliary supply filter circuit 110 to maintain power to the reference circuitry 116 during a power disruption, the communication operations of the IC 105 are more quickly restored when power is restored.

Figure 2:
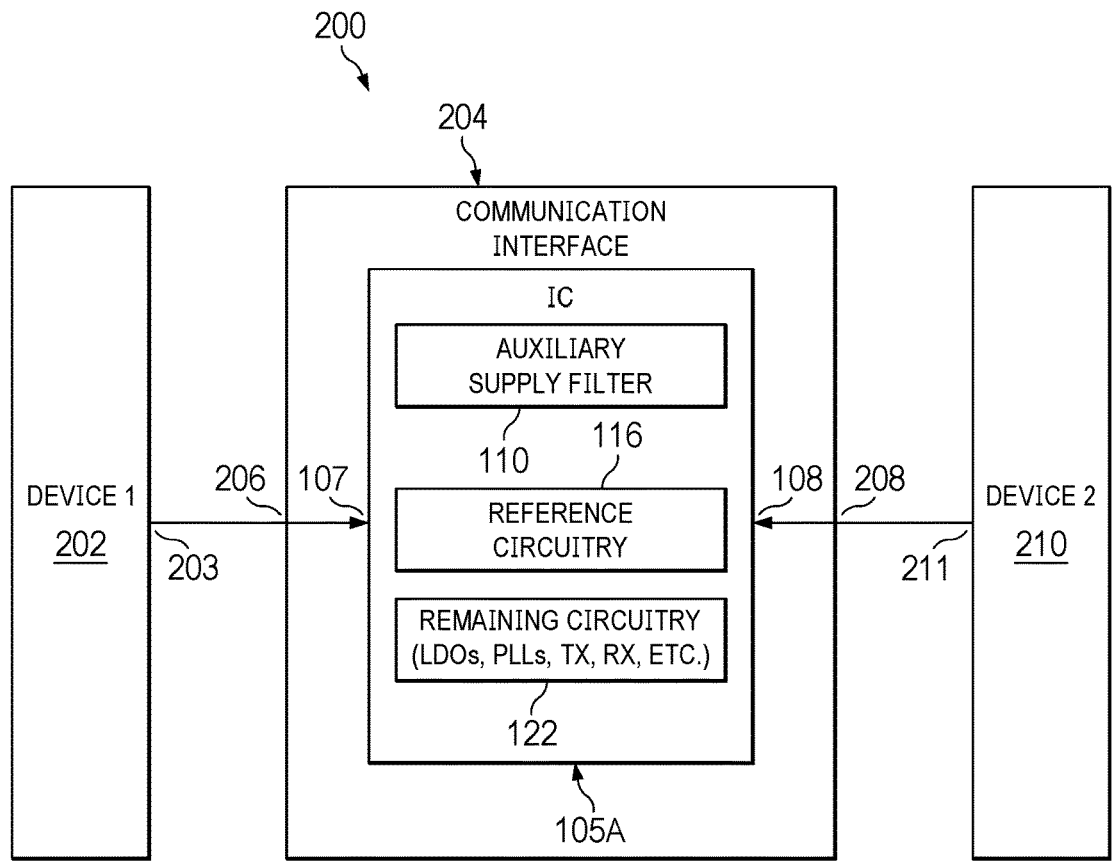
FIG. 2 is a diagram showing an example system including an auxiliary supply filter circuit.

FIG. 2 is a diagram showing an example system 200 including an auxiliary supply filter circuit 110. In the example of FIG. 2, the system 200 includes a first device 202, a communication interface 204, and a second device 210. The first device 202 has a terminal 203. The communication interface 204 has a first terminal 206 and a second terminal 208. The second device 210 has a terminal 211.

In some examples, the communication interface 204 includes an IC 105A. The IC 105A is an example of the IC 105 in FIG. 1. As shown, the IC 105A includes the auxiliary supply filter circuit 110, the reference circuitry 116, and remaining circuitry 122 described in FIG. 1. In the example of FIG. 2, the terminal 203 of the first device 202 is coupled to the first terminal 206 of the communication interface 204. The first terminal 206 of the communication interface 204 is coupled to the second terminal 107 of the IC 105A. The third terminal of the IC 105A is coupled to the second terminal 208 of the communication interface 204. The second terminal 208 of the communication interface 204 is also coupled to the terminal 211 of the second device 210. In some examples, the communication interface 204 may be part of the first device 202. In other examples, the communication interface 204 may be part of the second device 210. In some examples, the first device 202 is a first processor, and the second device 210 is a second processor. In other examples, the first device 202 is a sensor and the second device 210 is a processor. In some examples, the IC 105A is an isolation circuit and/or other communication interface circuitry.

In operation, the first device 202 and the second device 210 communicate with each other via the communication interface 204. If there is a disruption to the power supply for the communication interface 204 or the IC 105A, communications between the first device 202 and the second device 210 are interrupted. In such case, recovery of communications between first device 202 and the second device 210 begins once the power supply disruption ends. To expedite recovery, the auxiliary supply filter circuit 110 maintains power to the reference circuitry 116 during the power supply disruption as described in FIG. 1.

FIG. 3 is a diagram showing an example circuit 300 including an auxiliary supply filter circuit. The circuit 300 is an example of the IC 105 in FIG. 1 or the IC 105A in FIG. 2. In some examples, the circuit 300 is a communication circuit or isolation circuit. As shown, the circuit 300 has a first terminal 302, a second terminal 306, a third terminal 308, a fourth terminal 310, and a first ground terminal 311. The circuit 300 also has a fifth terminal 352, a sixth terminal 356, a seventh terminal 358, and a second ground terminal 359. In some examples, the first terminal 302, the second terminal 306, the third terminal 308, the fourth terminal 310, and the first ground terminal 311 are terminals of a first portion 301 of the circuit 300. Whereas, the fifth terminal 352, the sixth terminal 356, the seventh terminal 358, and the second ground terminal 359 are terminals of a second portion 350 of the circuit 300. Between the first portion 301 and the second portion 350 of the circuit 300 is isolation circuitry 330. The isolation circuitry 330 has a first terminal 332 and a second terminal 334.

In some examples, the first portion 301 of the circuit 300 includes an auxiliary supply filter circuit 110A, reference circuitry 116A, an LDO 121A, and remaining circuitry 122A. Examples of the reference circuitry 116A include a bandgap voltage reference (BG) circuit, a power-on reset (POR) circuit, and a reference generator circuit. The LDO 121A has an input and an output. The remaining circuitry 122A has the first input 124, the second input 126, first terminals 127A and 127B, the second terminal 128, and a ground terminal 312. The remaining circuitry 122A includes an input/output (IO) buffer 314 and transmitter (TX) circuitry 322. The IO buffer 314 has a first input 315, a second input 316, a first output 318, a second output 320, and a ground terminal 319. The transmitter circuitry 322 has a first input 324, a second input 325, a first terminal 326, and a ground terminal 327.

The second portion 350 of the circuit 300 includes an auxiliary supply filter circuit 110B, reference circuitry 116B, an LDO 121B, and remaining circuitry 122B. Examples of the reference circuitry 116B includes a BG circuit, a POR circuit, a reference generator circuit. The LDO has an input and an output. The remaining circuitry 122B has the first input 124, the second input 126, the first terminal 127, the second terminal 128, and a ground terminal 361. The remaining circuitry 122B includes receiver circuitry 362 and an IO buffer 372. The receiver circuitry 362 has a first input 364, a second input 366, a terminal 368, and a ground terminal 369. The IO buffer 372 has an input 374, a first terminal 376, a second terminal 378, and a ground terminal 379.

The input 112 of the auxiliary supply filter circuit 110A is coupled to the first terminal 302 of the circuit 300. The output 114 of the auxiliary supply filter circuit 110A is coupled to the input 118 of the reference circuitry 116A. The output 120 of the reference circuitry 116A is coupled to the input of the LDO 121A. The output of the LDO 121A is coupled to the second input 126 of the remaining circuitry 122A. The first input 124 of the remaining circuitry 122A is coupled to the first terminal 302 of the circuit 300. The first terminal 127A of the remaining circuitry 122A is coupled to the second terminal 306 of the circuit 300. The first terminal 127B of the remaining circuitry 122A is coupled to the third terminal 308 of the circuit 300. The second terminal 128 of the remaining circuitry 122A is coupled to the fourth terminal 310 of the circuit 300. The ground terminal 312 of the remaining circuitry 122A is coupled to the first ground terminal 311 of the circuit 300.

The first input 315 of the IO buffer 314 is coupled to the first input 124 of the remaining circuitry 122A. The second input 316 of the IO buffer 314 is coupled to the first terminal 127A of the remaining circuitry 122A. The first output 318 of the IO buffer 314 is coupled to the first terminal 127B of the remaining circuitry 122A. The second output 320 of the IO buffer 314 is coupled to the first input 324 of the transmitter circuitry 322. The second input 325 of the transmitter circuitry 322 is coupled to the second input 126 of the remaining circuitry 122A. The first terminal 326 of the transmitter circuitry 322 is coupled to the second terminal 128 of the remaining circuitry 122A. The ground terminal 327 of the transmitter circuitry 322 is coupled to the ground terminal 312 of the remaining circuitry 122A.

The fourth terminal 310 of the circuit 300 is coupled to the first terminal 332 of the isolation circuitry 330. The second terminal 334 of the isolation circuitry 330 is coupled to the seventh terminal 358 of the circuit 300. In some examples, the isolation circuitry 330 includes one or more transformers separated by an isolation barrier or capacitors separated by an isolation barrier. In other examples, the isolation circuitry 330 may vary. The isolation circuitry 330 allows communication of data and power between different voltage domains having different grounds, while preventing direct current and unwanted alternating current from passing between the portions 301 and 350.

The input 112 of the auxiliary supply filter circuit 110B is coupled to the fifth terminal 352 of the circuit 300. The output 114 of the auxiliary supply filter circuit 110B is coupled to the input 118 of the reference circuitry 116B. The output 120 of the reference circuitry 116B is coupled to the input of the LDO 121B. The output of the LDO 121B is coupled to the second input 126 of the remaining circuitry 122B. The first input 124 of the remaining circuitry 122B is coupled to the fifth terminal 352 of the circuit 300. The first terminal 127 of the remaining circuitry 122B is coupled to the sixth terminal 356 of the circuit 300. The second terminal 128 of the remaining circuitry 122B is coupled to the seventh terminal 358 of the circuit 300. The ground terminal 361 of the remaining circuitry 122B is coupled to the second ground terminal 359 of the circuit 300.

The first input 364 of the receiver circuitry 362 is coupled to the second input 126 of the remaining circuitry 122B. The second input 366 of the receiver circuitry 362 is coupled to the second terminal 128 of the remaining circuitry 122B. The terminal 368 of the receiver circuitry 362 is coupled to the first terminal 376 of the IO buffer 372. The ground terminal 369 of the receiver circuitry 362 is coupled to the ground terminal 361 of the remaining circuitry 122B. The input 374 of the IO buffer 372 is coupled to the first input 124 of the remaining circuitry 122B. The second terminal 378 of the IO buffer 372 is coupled to the first terminal 127 of the remaining circuitry 122B. The ground terminal 379 of the IO buffer 372 is coupled to the ground terminal 361 of the remaining circuitry 122B.

In some examples, the first portion 301 of the circuit 300 operates to: receive an input voltage (VIN) at the first terminal 302 of the circuit 300; receive input data (INx) at the second terminal 306 of the circuit 300; provide an LED control signal at the third terminal 308 of the circuit 300 responsive to VIN, INx, auxiliary supply filter circuit 110A operations, reference circuitry 116A operations, LDO 121A operations, and IO buffer 314 operations; provide transmit data at the fourth terminal 310 responsive to IO buffer 314 operations and transmitter circuitry 322 operations; and output the buffered data from the first portion 301 of the circuit 300 responsive to VIN, INx, auxiliary supply filter circuit 110A operations, reference circuitry 116A operations, LDO 121A operations, IO buffer 314 operations, and transmitter circuitry 322 operations. In some examples, the LED control signal is used to control operations of an external LED to provide a visual indication of ongoing communications (or lack thereof) through the circuit 300. In some examples, the isolation circuitry 330 operates to convey data from the first portion 301 of the circuit 300 to the second portion 350 of the circuit 300 or vice versa in an electrically isolated manner.

More particularly, during normal operations (i.e., VIN not disrupted), the auxiliary supply filter circuit 110A operates to: receive VIN at its input 112; and provide a filtered VIN at its output 114 responsive to VIN. If VIN is disrupted, the auxiliary supply filter circuit 110A operates to temporarily continue providing the filtered VIN at its output 114 and prevent reverse current flow (from the output 114 to the input 112). The reference circuitry 116A operates to: receive the filtered VIN at its input 118; and provide a reference signal at its output 120 responsive to the filtered VIN. The LDO 121A operates to: receive the reference signal at its input; and provide regulated voltage and/or regulated current at its output responsive to the reference signal. The IO buffer 314 operates to: received VIN at its first input 315; receive INx at its second input 316; provide LEDx at its first output 318 responsive to VIN, INx and ongoing communications; provide buffered data at the second output 320 responsive to VIN and INx. In some examples, INx is received at the second input 316 from a first device (e.g., the first device 202 in FIG. 2) via the second terminal 306 of the circuit 300. The transmitter circuitry 322 operates to: receive the buffered data at its first input 324; receive a regulated voltage and/or regulated current at its second input 325; and provide transmit data at its first terminal 326 responsive to the buffered data, and the regulated voltage and/or the regulated current. The transmit data is output from the first portion 301 of the circuit 300 to first terminal 332 of the isolation circuitry 330 via the fourth terminal 310 of the circuit 300.

In some examples, the second portion 350 of the circuit 300 operates to: receive a power supply voltage (VCC) at the fifth terminal 352 of the circuit 300; receive the transmit data at the seventh terminal 358 of the circuit 300; and provide buffered data at the sixth terminal 356 of the circuit 300 responsive to VCC, auxiliary supply filter circuit 110B operations, reference circuitry 116B operations, LDO 121B operations, receiver circuitry 362 operations, and IO buffer 372 operations. In some examples, the sixth terminal 356 of the circuit 300 is a serial or parallel IO interface and is coupled to a second device (e.g., the second device 210 in FIG. 2). With the auxiliary supply filter circuits 110A and 110B, the circuit 300 can quickly recover from disruptions to VIN and/or VCC by maintaining power to the reference circuitries 116A and 116B. In this manner, the circuit 300 can reduce communication delays due to VIN and/or VCC disruption. In some examples, VIN may be 24V when not disrupted. When disrupted, VIN may drop to 0V. In some examples, VCC may be 5V when not disrupted. When disrupted, VCC may drop to 0V. In other examples, the values of VIN and VCC, when not disrupted, may vary. In some examples, VIN may vary between 10V to 36V.

More particularly, during normal operations (i.e., VCC not disrupted), the auxiliary supply filter circuit 110B operates to: receive VCC at its input 112; and provide a filtered VCC at its output 114 responsive to VCC. If VCC is disrupted, the auxiliary supply filter circuit 110B operates to temporarily continue providing the filtered VCC at its output 114 and prevent reverse current flow (from the output 114 to the input 112). The reference circuitry 116B operates to: receive the filtered VCC at its input 118; and provide a reference signal at its output 120 responsive to the filtered VCC. The LDO 121B operates to: receive the reference signal at its input; and provide regulated voltage and/or regulated current at its output responsive to the reference signal. The receiver circuitry 362 operates to: receive regulated voltage and/or regulated current at its first input 364; receive the transmit data from the first portion 301 of the circuit 300 at its second input 366; and provide received data at its terminal 368 responsive to the transmit data and the regulated voltage and/or regulated current. The IO buffer 372 operates to: receive VCC at its input 374; receive the receive data at its first terminal 376; and provide buffered data at its second terminal 378 responsive to VCC and the receive data. The buffered data is conveyed from the second terminal 378 to another device (e.g., the second device 210 in FIG. 2) via the sixth terminal 356 of the circuit 300.

In the example of FIG. 3, communications are described as unidirectional communications from the second terminal 306 of the circuit 300 to the sixth terminal 356 of the circuit 300. In other examples, communications of the circuit 300 may be unidirectional communications from the sixth terminal 356 of the circuit 300 to the second terminal 306 of the circuit 300. In other examples, communications of the circuit 300 may be bidirectional communications between the sixth terminal 356 of the circuit 300 and the second terminal 306 of the circuit 300.

Figure 4:
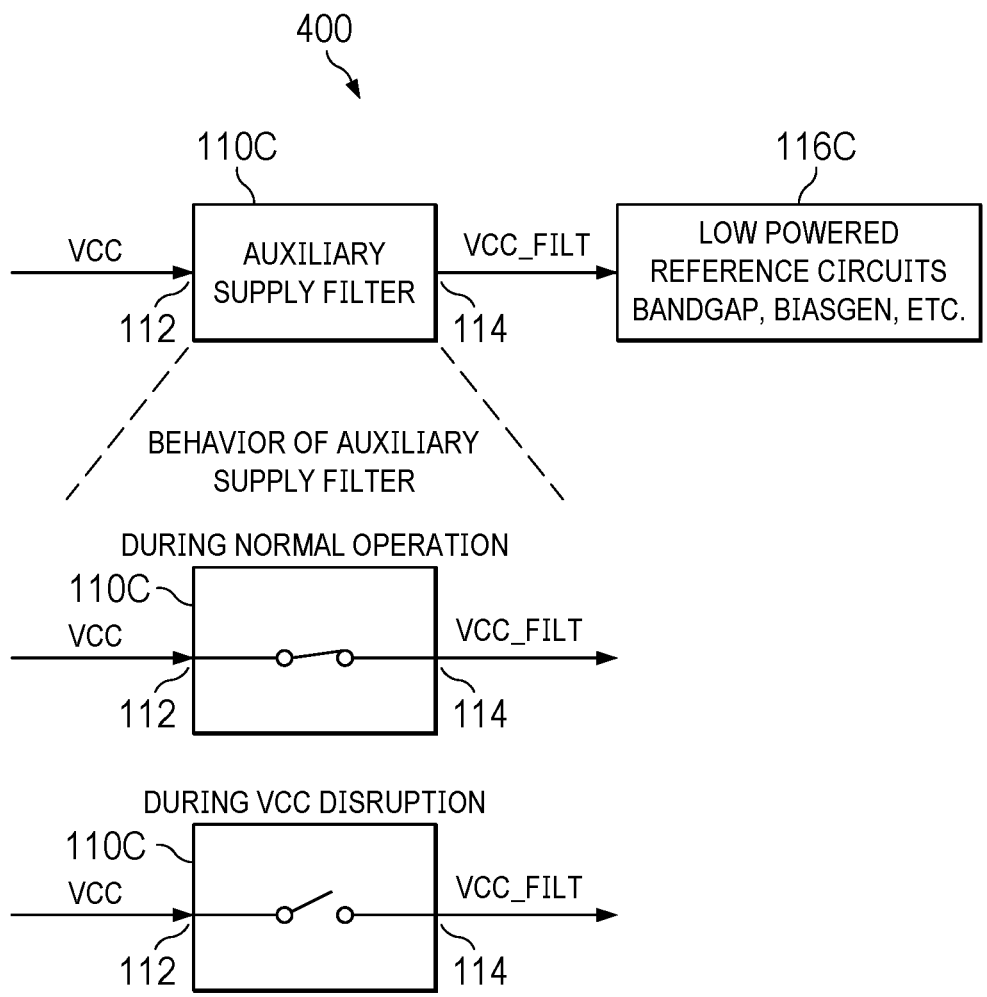
FIG. 4 is a diagram showing example auxiliary supply filter circuit operations.

FIG. 4 is a diagram 400 showing example auxiliary supply filter circuit operations. In the diagram 400, an auxiliary supply filter circuit 110C is between a power supply (e.g., that provides VCC) and reference circuitry 116C. The auxiliary supply filter circuit 110C is an example of the auxiliary supply filter circuit 110 in FIGS. 1 and 2, the auxiliary supply filter circuit 110A in FIG. 3, or the auxiliary supply filter circuit 110B in FIG. 3. In the example of FIG. 4, the auxiliary supply filter circuit 110C receives VCC at its input 112 and provides a filtered VCC (VCC_FILT) at its output 114 for use by the reference circuitry 116C. During normal operations (when power is not disrupted), the auxiliary supply filter circuit 110C performs a closed switch function. During VCC disruption, the auxiliary supply filter circuit 110C performs an open switch function. With the open switch function, the auxiliary supply filter circuit 110C prevents VCC_FILT from dropping significantly in the event of VCC disruption due to current flow from the output 114 back to the input 112.

Figure 5:
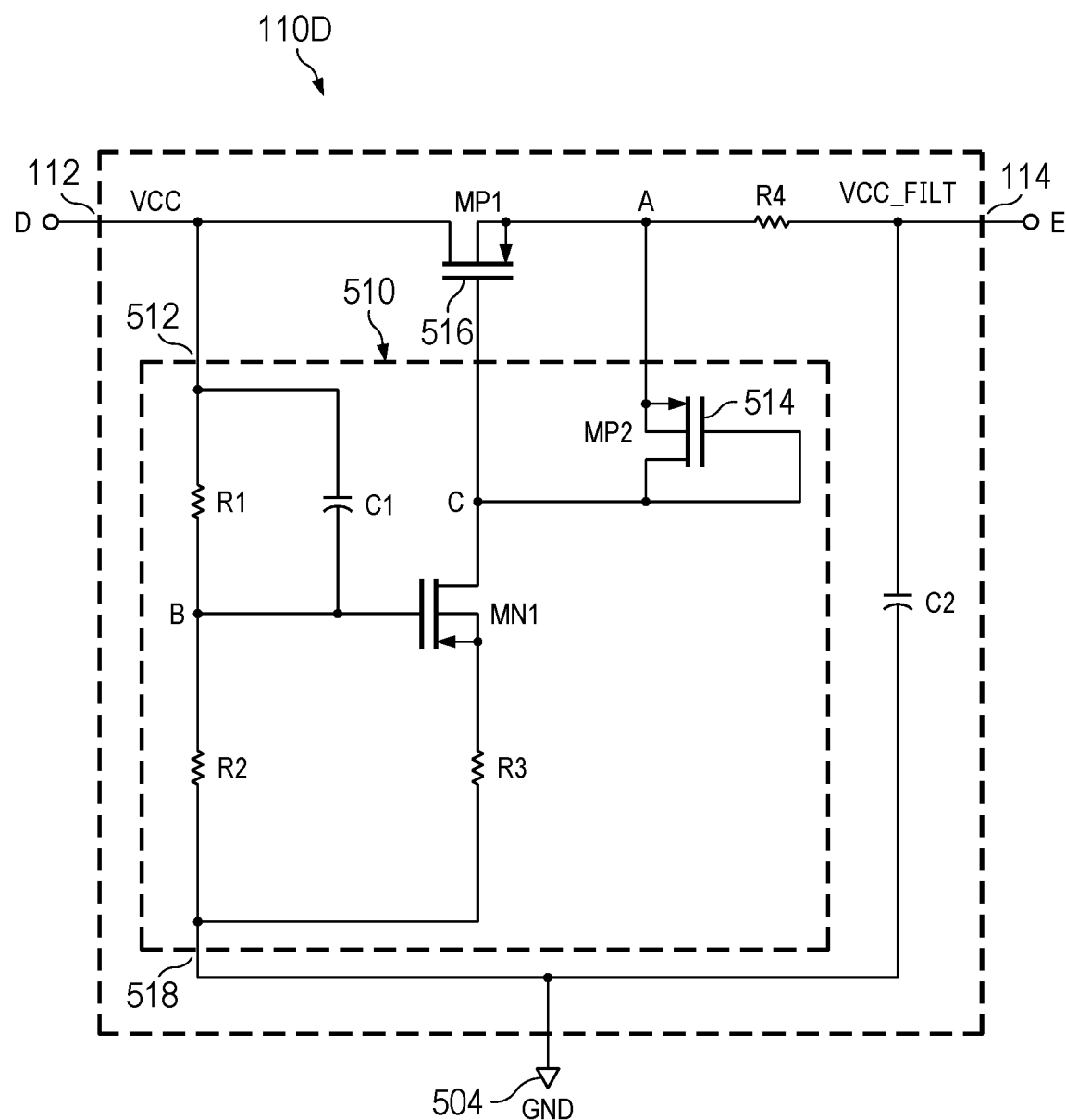
FIG. 5 is a schematic diagram showing an example auxiliary supply filter circuit.

FIG. 5 is a schematic diagram showing an example auxiliary supply filter circuit 110D. The auxiliary supply filter circuit 110D is an example of the auxiliary supply filter circuit 110 in FIGS. 1 and 2, the auxiliary supply filter circuit 110A in FIG. 3, the auxiliary supply filter circuit 110B in FIG. 3, or the auxiliary supply filter circuit 110C in FIG. 4. In the example of FIG. 5, the auxiliary supply filter circuit 110D has the input 112, the output 114, and a ground terminal 504. The auxiliary supply filter circuit 110D includes a transistor MP1 and a switch controller 510 for MP1. In the example of FIG. 5, the transistor MP1 is a p-channel field effect transistor ("PFET").

The switch controller 510 has a first terminal 512, a second terminal 514, a third terminal 516, and a ground terminal 518. The switch controller 510 includes resistors R1, R2, and R3, a capacitor C1, and transistors MN1 and MP2. In the example of FIG. 5, the transistor MN1 is an n-channel field effect transistor ("NFET") and the transistor MP2 is a PFET. The auxiliary supply filter circuit 110D also includes an RC circuit including R4 and C2. In the example of FIG. 5, each of the resistors R1, R2, R3, R4 has first and second terminals. Each of the capacitors C1 and C2 has first and second terminals. Also, each of the transistors MP1, MN1, MP2 has a first terminal, a second terminal, and a control terminal. The first and second terminals of the FETs are also referred to herein as first and second control terminals.

As shown, the first current terminal of MP1 is coupled to the input 112 of the auxiliary supply filter circuit 110D. The second current terminal of MP1 is coupled to the first terminal of the resistor R4. The second terminal of the resistor R4 is coupled to the output 114 of the auxiliary supply filter circuit 110D. The second terminal of the resistor R4 is also coupled to the first terminal of the capacitor C2. The second terminal of the capacitor C2 is coupled to the ground terminal 504.

The first terminal of the switch controller 510 is coupled to the input 112 of the auxiliary supply filter circuit 110D. The second terminal 514 of the switch controller 510 is coupled to the second current terminal of the transistor MP1. The third terminal 516 of the switch controller 510 is coupled to the control terminal of the transistor MP1. The ground terminal 518 of the switch controller 510 is coupled to the ground terminal 504 of the auxiliary supply filter circuit 110D. The first terminal 512 of the switch controller 510 is coupled to the first terminals of the resistor R1 and the capacitor C1. The second terminal of the resistor R1 is coupled to the first terminal of the resistor R2, the second terminal of the capacitor C1, and the control terminal of the transistor MN1. The second terminal of the resistor R2 is coupled to the ground terminal 518 of the switch controller 510. The first current terminal of the transistor MN1 is coupled to the third terminal 516 of the switch controller 510, the second current terminal of the transistor MP2, and the control terminal of the transistor MP2. The first current terminal of the transistor MP2 is coupled to the second terminal 514 of the switch controller 510. The first terminal of the resistor R3 is coupled to the second current terminal of the transistor MN1. The second terminal of the resistor R3 is coupled to the ground terminal 518 of the switch controller 510.

In some examples, the auxiliary supply filter circuit 110D operates to: receive VCC at its input 112; and provide VCC_FILT at its output 114 responsive to the transistor MP1, the RC circuit (R4 and C2), and switch controller 510 operations. During normal operations (when VCC is not disrupted), the auxiliary supply filter circuit 110D operates to: provide VCC_FILT at its output 114 responsive to VCC at its input 112; and charge C1 responsive to VCC. In the event of a disruption to VCC, the auxiliary supply filter circuit 110D operates to turn off MP1 quickly (e.g., before VCC has a chance to drop significantly) responsive to switch controller 510 operations. In some examples, MP1 may be turned off within about 0.01 us to 0.05 us of disruption to VCC.

In the example of FIG. 5, the auxiliary supply filter circuit 110D includes nodes A, B, C, D, and E. As VCC ramps up, node B charges up, since initially transistor MN1 is off. Also, node C is high impedance and is therefore charged up with VCC. As VCC is ramping up, node A is charged up through a body diode (not explicitly shown) of the transistor MP1. If shown, the body diode extends between transistor MP1's drain and source terminals and enables current flow from the drain terminal to the source terminal even if a channel has not been induced.

In some examples, the switch controller 510 is coupled to the control terminal of the transistor MP1 and is configured to: turn on the transistor MP1 responsive to a first supply voltage level at the input of the auxiliary supply circuit; and turn off the transistor MP1 responsive to a second supply voltage level at the input of the auxiliary supply circuit. In some examples, the first supply voltage level is 5V and the second supply voltage level is 0V. In other examples, the first supply voltage level is 24V and the second supply voltage level is 0V. In other examples, the first supply voltage level may vary between 11V to 36V and the second supply voltage level is 0V.

More particularly, once node B charges up above the threshold voltage ($V_T$) of the transistor MN1, node C is pulled low and the transistor MP2 turns on. Turning on MP2 causes the voltage at node C to be pulled low, which turns on the transistor MP1 fully and provides a low resistance path between VCC and node A. In some examples, the transistor MP2 is sized such that $V_{GS}$ of the transistor MP2 is slightly over the threshold voltage ($V_{TH}$) of the transistor MP1. In some examples, the size of the resistor R3 is selected to limit the current through the transistors MP2 and MN1. The capacitor C1 is used to turn on the transistor MN1 fast with faster supply ramps. The resistor R4 and the capacitor C2 form a high frequency low pass filter. As used herein, "turning on" a transistor or switch may include passing a range of currents through the transistor or switch. As understood in the relevant art, some control of the amount of current passed through a transistor or switch is possible by adjustment of the control signal provided to the control terminal of a transistor or switch.

In some examples, the values of the resistors R1 and R2 is in the MΩ range and may be based on the static power specification of the IC or device that includes the auxiliary supply filter circuit 110D. For example, if the static power specification target is for the resistors R1 and R2 to consume less than 1% of the overall current, examples values for the resistors R1 and R2 is respectively 1 MΩ and 1.2 MΩ. In some examples, the value of C1 is a function of the fastest VCC ramp supported on the IC or device that includes the auxiliary supply filter circuit 110D. If the fastest VCC ramp is 100 ns, an example C1 value may be 500 fF. The value of C4 depends on load supported by the auxiliary supply filter circuit 110D. For a given load current (ILoad), a given time for which supply crash needs to be filtered (Tfilt), a minimum supply voltage (VIL) for the reference circuitry, and minimum VCC (VCCmin) for the IC or device that includes the auxiliary supply filter circuit 110D, the value of C4 may be calculated as:

$$C4 = \frac{Iload * Tfilt}{VCCmin - VIL}.$$

If VCCmin=1.71V, VIL=1.46V, ILoad=5 uA, and Tfilt>3 us, then an example value for C4 may be 60 pF.

The value of R4 is used to provide low pass filtering. While there is no limit on the lower range of R4 values, higher R4 values improve filtering. The upper range of R4 values may be limited by a maximum drop limit between VCC and VCC_FILT. In some examples, R4 is 2 kΩ, resulting in a maximum drop between VCC and VCC_FILT of 10 mV. The width/length (W/L) ratio of the transistor MN1 may be selected to be low to reduce current through MN1 and also to keep node C weakly pulled down during normal operations (when VCC is not disrupted). In some examples, the W/L ratio for the transistor MN1 is 1/10. R3 reduces the current through the transistor MN1. In some examples, the value of R3 is in 100 kΩ-200 kΩ range. The transistor MP1 carries current based on the minimum drop between VCC and VCC_FILT. In some examples, if the current through transistor MP1 is 5 uA, the W/L ratio of the transistor MP1 may be 20/0.7, and the max voltage drop across MP1 is 60 mV. In some examples, the transistor MP2 is designed to have a gate-to-source voltage ($V_{GS}$) slightly above the $V_{TH}$ of the transistor MP1. Since the current through transistor MP2 is small, the transistor MP2 can be small. In some examples, the transistor MP2 has a W/L ratio of 1/0.7. When VCC crashes, the turn off time of the transistor MP1 should be fast to reduce the amount of VCC_FILT discharge through the transistor MP1. In some examples, a target turn off time for the transistor MP1 is less than 1% of Tfilt. Again, Tfilt is the amount of time the supply crash is filtered out.

During disruption of VCC (e.g., VCC crashes to zero volts), the capacitor C2 holds the voltage until VCC comes back. With VCC disrupted, the transistor MN1 is turned off and VCC_FILT starts to discharge through the transistor MP1 until the $V_{GS}$ of the transistor MP1 drops to $V_{TH}$. Since the transistor MP1 is biased just above its $V_{TH}$, the transistor MP1 is quickly turned off once VCC crashes. Turning off the transistor MP1 in this manner, creates a high impedance path between the input 112 and the output 114 of the auxiliary supply filter circuit 110D such that no reverse current flows through the transistor MP1. By using low current reference circuitry and careful selection of the capacitor C2, VCC_FILT can supply power to reference circuitry for a desired duration and while supply noise is filtered out.

Figure 6A:
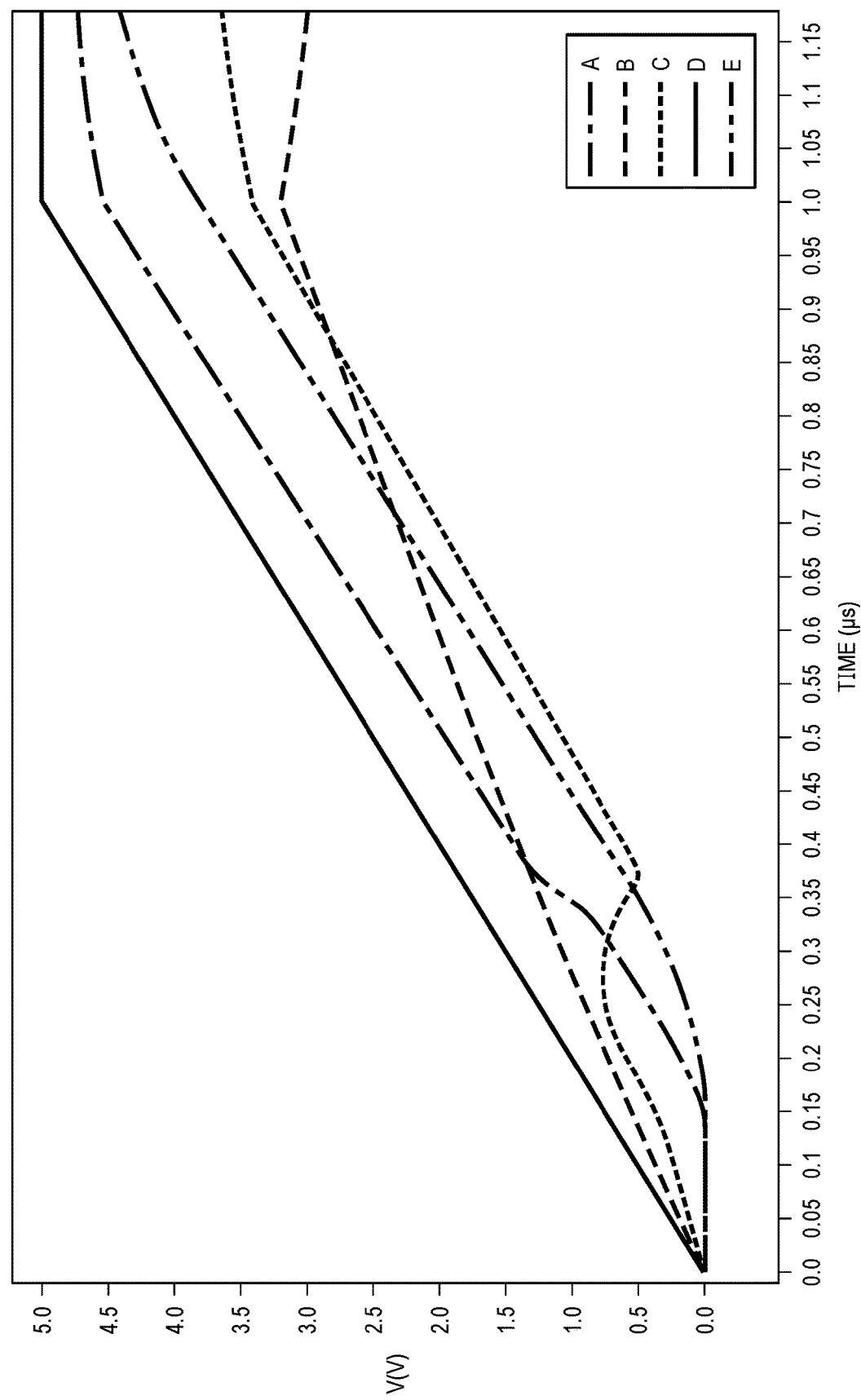
FIG. 6A is a graph showing voltages related to the example auxiliary supply filter circuit of FIG. 5 during power up.

FIG. 6A is a graph 600 showing voltages related to the example auxiliary supply filter circuit of FIG. 5 during power up. In the graph 600, the voltages at nodes A, B, C, D, and E of the auxiliary supply filter circuit 110D are shown during power up of VCC. As VCC at node D ramps up, the voltages at nodes B and C ramp up. Once the voltage at node C reaches a target (e.g., $V_{TH}$ of the transistor MP1 such as 0.7V), the transistor MP1 is turned on and the voltage at nodes A and E begin to ramp up. Eventually, VCC at node D reaches a target level (e.g., 5.0V in FIG. 6A) and the voltages at nodes A and node E increase, approaching the level of VCC (e.g., VCC_FILT is between 4.0V and 4.5V due to voltage drop across the transistor MP1 and R4). With the filtering function of the auxiliary supply filter circuit 500, high frequencies on VCC and VCC disruptions are filtered.

Figure 6B:
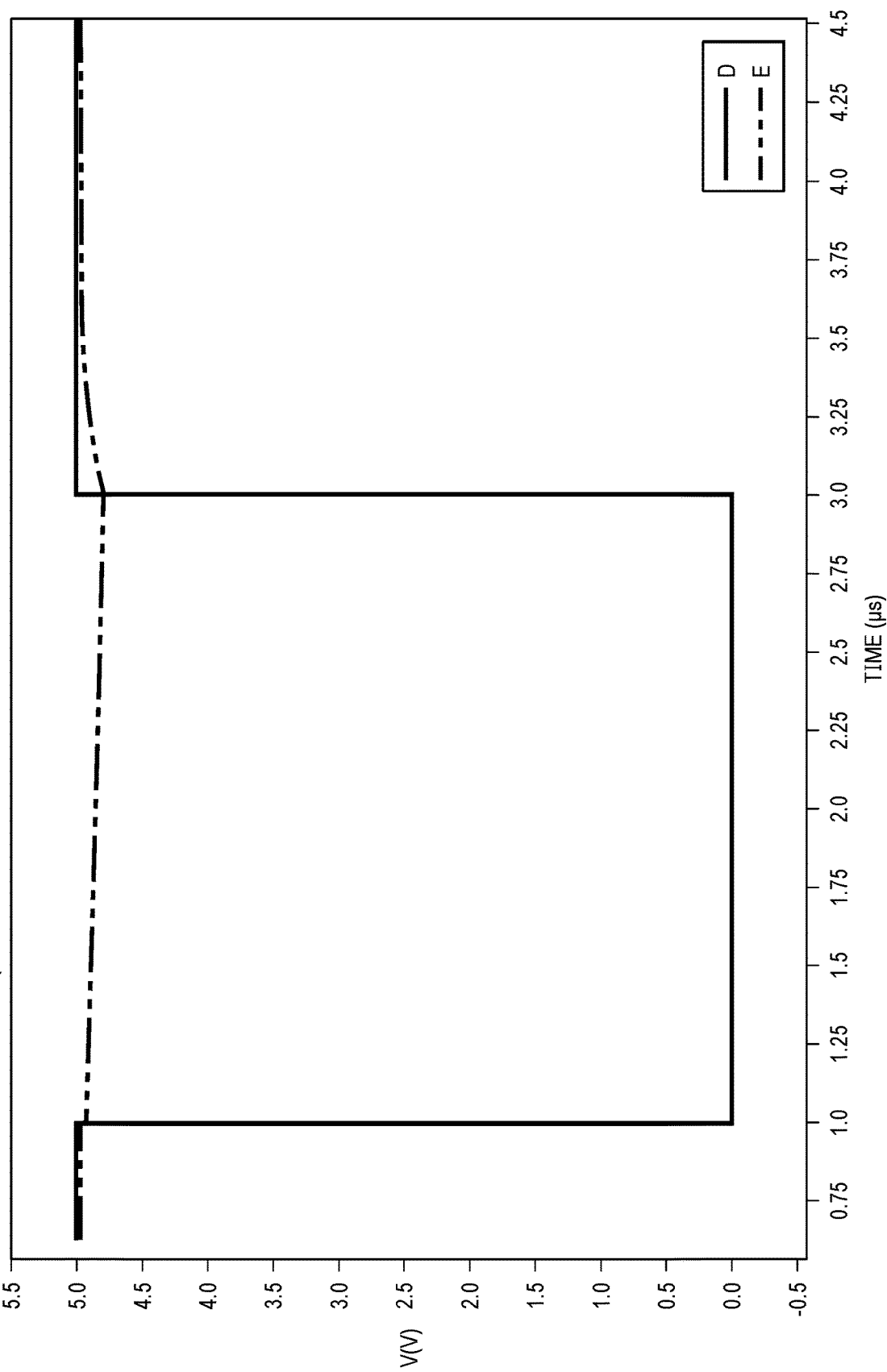
FIG. 6B is a graph showing voltages related to the example auxiliary supply filter circuit of FIG. 5 during a power supply interruption.

FIG. 6B is a graph 610 showing voltages related to the example auxiliary supply filter circuit 500 of FIG. 5 during a power supply interruption. In the graph 600, the voltages at nodes D and E of the auxiliary supply filter circuit 110D are shown during disruption of VCC. As shown, disruption of VCC (when VCC drops to 0 V) causes the voltage at node D to drop to zero for some time (in this example about 2 microseconds). During this time of low voltage at node D, the voltage (VCC_FILT) at node E is maintained close to the target voltage for VCC. Eventually, the VCC disruption ends and normal operations continue. Without the auxiliary supply filter circuit 110D, disruption of VCC would cause reference circuitry (e.g., the reference circuitry 116 or variants herein) to lose power. While recovery of the reference circuitry is possibly once VCC is restored, the recovery time of the reference circuitry is slow compared to the recovery time of other circuitry such as the remaining circuit 122 or variants herein. To prevent power loss to the reference circuitry when VCC is disrupted, the auxiliary supply filter circuit 110D provides VCC_FILT as described herein, which filters high frequency signals on VCC and temporary disruptions in VCC.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component and/or a conductor.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit comprising:
   reference circuitry having an input; and
   a supply circuit having an input and an output, the output of the supply circuit is coupled to the input of the reference circuitry, and the supply circuit including:
   a capacitor having a first terminal and a second terminal, the first terminal of the capacitor coupled to the output of the supply circuit;
   a switch having a first terminal, a second terminal, and a control terminal, the first terminal of the switch coupled to the input of the supply circuit, the second terminal of the switch coupled to the output of the supply circuit; and
   a controller coupled to the control terminal of the switch, the controller configured to:
   turn on the switch responsive to a first supply voltage level at the input of the supply circuit; and turn off the switch responsive to a second supply voltage level at the input of the supply circuit;
wherein the switch is a first switch, and the controller includes:
a resistor having a first terminal and a second terminal; and
a second switch having a first terminal, a second terminal, and a control terminal, the first terminal of the second switch coupled to the control terminal of the first switch, the second terminal of the second switch coupled to the first terminal of the resistor.

2. The circuit of claim 1, wherein the resistor is a first resistor, and the controller includes:
a second resistor having a first terminal and a second terminal, the second terminal of the second resistor coupled to the control terminal of the second switch; and
a third resistor having a first terminal and a second terminal, the first terminal of the third resistor coupled to the control terminal of the second switch.

3. The circuit of claim 2, wherein the capacitor is a first capacitor, and the controller includes a second capacitor having a first terminal and a second terminal, the first terminal of the second capacitor coupled to the first terminal of the second resistor, and the second terminal of the second capacitor coupled to the control terminal of the second switch.

4. The circuit of claim 1, wherein the resistor is a first resistor, the circuit further comprises a second resistor having a first terminal and a second terminal, the second terminal of the second resistor coupled to the output, and the controller includes a third switch having a first terminal, a second terminal, and a control terminal, the first terminal of the third switch coupled to the first terminal of the second resistor, and the second terminal of the third switch coupled to the control terminal of the first switch.

5. The circuit of claim 4, wherein the first switch is a first transistor, the second switch is a second transistor, the third switch is a third transistor, the third transistor is sized relative to the first transistor so that a gate-to-source voltage of the third transistor is greater than a threshold voltage of the first transistor.

6. The circuit of claim 5, wherein the first transistor is a p-channel transistor, the second transistor in an n-channel transistor, and the third transistor is a p-channel transistor.

7. The circuit of claim 1, further comprising reference circuitry having an input and an output, the input of the reference circuitry coupled to the output of the supply circuit, and the reference circuitry including a bandgap voltage reference.

8. The circuit of claim 7, further comprising:
a power regulator or clock regulator having an input and an output, the input of the power regulator or clock regulator coupled to the output of the reference circuit; and
transmitter circuitry or receiver circuitry coupled to the output of the power regulator or clock regulator.

9. The circuit of claim 1, further comprising:
transmitter circuitry having an output;
receiver circuitry having an input; and
isolation circuitry having a first terminal and a second terminal, the first terminal of the isolation circuitry is coupled to the output of the transmitter circuitry, and the second terminal of the isolation circuitry is coupled to the input of the receiver circuitry.

10. A circuit comprising:
a supply circuit having an input and an output, the supply circuit including:
a first resistor having a first terminal and a second terminal, the second terminal of the first resistor coupled to the output;
a capacitor having a first terminal and a second terminal, the first terminal of the capacitor coupled to the output;
a first switch having a first terminal, a second terminal, and a control terminal, the first terminal of the first switch coupled to the input, and the second terminal of the first switch coupled to the first terminal of the first resistor;
a second resistor having a first terminal and a second terminal; and
a second switch having a first terminal, a second terminal, and a control terminal, the first terminal of the second switch coupled to the control terminal of the first switch, and the second terminal of the second switch coupled to the first terminal of the second resistor;
wherein the supply circuit includes:
a third resistor having a first terminal and a second terminal, the second terminal of the third resistor coupled to the control terminal of the second switch; and
a fourth resistor having a first terminal and a second terminal, the first terminal of the fourth resistor coupled to the control terminal of the second switch.

11. The circuit of claim 10, wherein the capacitor is a first capacitor, and the supply circuit includes a second capacitor having a first terminal and a second terminal, the first terminal of the second capacitor coupled to the first terminal of the third resistor, and the second terminal of the second capacitor coupled to the control terminal of the second switch.

12. The circuit of claim 10, wherein the supply circuit includes a third switch having a first terminal, a second terminal, and a control terminal, the first terminal of the third switch coupled to the first terminal of the first resistor, and the second terminal of the third switch coupled to the control terminal of the first switch.

13. The circuit of claim 11, wherein the supply circuit is configured to:
turn on the first switch responsive to a supply voltage at the input, the capacitor being charged while the first switch is turned on; and
turn off the first switch responsive to the supply voltage at the input being disrupted, the capacitor providing its charge to the output while the first switch is turned off.

14. The circuit of claim 13, wherein the supply circuit is configured to turn on the first switch by:
dividing the supply voltage;
charging the second capacitor responsive to the supply voltage; and
controlling the second switch responsive to the divided supply voltage and the charged second capacitor.

15. A circuit comprising:
a supply circuit having an input and an output, the supply circuit including:
a first resistor having a first terminal and a second terminal, the second terminal of the first resistor coupled to the output;
a capacitor having a first terminal and a second terminal, the first terminal of the capacitor coupled to the output;

a first transistor having a first terminal, a second terminal, and a control terminal, the first terminal of the first transistor coupled to the input, and the second terminal of the first transistor coupled to the first terminal of the first resistor; and a second transistor having a first terminal, a second terminal, and a control terminal, the first terminal of the second transistor coupled to the first terminal of the first resistor, and the second terminal of the second transistor coupled to the control terminal of the first transistor;

wherein the supply circuit includes:

a second resistor having a first terminal and a second terminal; and a third transistor having a first terminal, a second terminal, and a control terminal, the first terminal of the third transistor coupled to the control terminal of the first transistor, and the second terminal of the third transistor coupled to the first terminal of the second resistor.

16. The circuit of claim 15, wherein the supply circuit includes:

a third resistor having a first terminal and a second terminal, the second terminal of the third resistor coupled to the control terminal of the third transistor; and a fourth resistor having a first terminal and a second terminal, the first terminal of the fourth resistor coupled to the control terminal of the third transistor.

17. The circuit of claim 16, wherein the capacitor is a first capacitor, and the supply circuit includes a second capacitor having a first terminal and a second terminal, the first terminal of the second capacitor coupled to the first terminal of the third resistor, and the second terminal of the second capacitor coupled to the control terminal of the third transistor.

* * * * *